United States Patent
Hilgrath

(12) 
(10) Patent No.: US 6,316,716 B1
(45) Date of Patent: Nov. 13, 2001

(54) SOLAR CELL AND METHOD FOR PRODUCING SUCH A CELL

(75) Inventor: Just Hilgrath, Ilsfeld (DE)

(73) Assignee: Angewandte Solarenergie - Ase GmbH, Alzenau (DE)

( * ) Notice: Subject to any disclaimer, the term of this patent is extended or adjusted under 35 U.S.C. 154(b) by 0 days.

(21) Appl. No.: 09/567,153

(22) Filed: May 9, 2000

(30) Foreign Application Priority Data

May 11, 1999 (DE) ............................................. 199 21 545

(51) Int. Cl.[7] .......................... H01L 31/04; H01L 27/142
(52) U.S. Cl. .......................... 136/255; 136/249; 136/256; 136/262; 257/437; 257/449; 257/461; 438/74; 438/92; 438/93
(58) Field of Search .............................. 136/249 TJ, 255, 136/256, 262; 257/437, 449, 461; 438/74, 92, 93

(56) References Cited

U.S. PATENT DOCUMENTS

| | | | |
|---|---|---|---|
| 4,759,803 | | 7/1988 | Cohen ................................. 136/244 |
| 4,997,491 | * | 3/1991 | Hokuyo et al. ...................... 136/255 |
| 5,009,720 | * | 4/1991 | Hokuyo et al. ...................... 136/255 |
| 6,103,970 | * | 8/2000 | Kilmer et al. ....................... 136/263 |

FOREIGN PATENT DOCUMENTS

| | | | |
|---|---|---|---|
| 0327023 | | 8/1989 | (EP) . |
| 2346010-A | * | 7/2000 | (GB) . |
| 9-64397-A | * | 3/1997 | (JP) . |
| WO-99/62125-A1 | * | 12/1999 | (WO) . |

OTHER PUBLICATIONS

"A 27.3% Efficient $Ga_{0.5}In_{0.5}P/GaAs$ Tandem Solar Cell", J.M. Cohen et al, Appl. Phys.Lett. 56(7), Feb. 12, 1990, pp. 623–625.

* cited by examiner

Primary Examiner—Alan Diamond
(74) Attorney, Agent, or Firm—Dennison, Scheiner, Schultz & Wakeman

(57) ABSTRACT

A solar cell includes a substrate carrier for current generating photoactive layers that include at least one front layer and one layer toward the substrate of different polarities, a front contact, at least one back contact and an integral protective diode which has a polarity opposite the solar cell integrated in and disposed on a front side of the solar cell and including at least one diode semiconductor layer. A tunnel diode extends between the photoactive layers and a region of the substrate toward the front, the tunnel diode being recessed adjacent the protective diode. The region of the substrate toward the front, or a layer toward the front applied to or formed by the front, together with a photoactive layer of corresponding polarity toward the front, make up the at least one diode semiconductor layer of the protective diode.

21 Claims, 5 Drawing Sheets

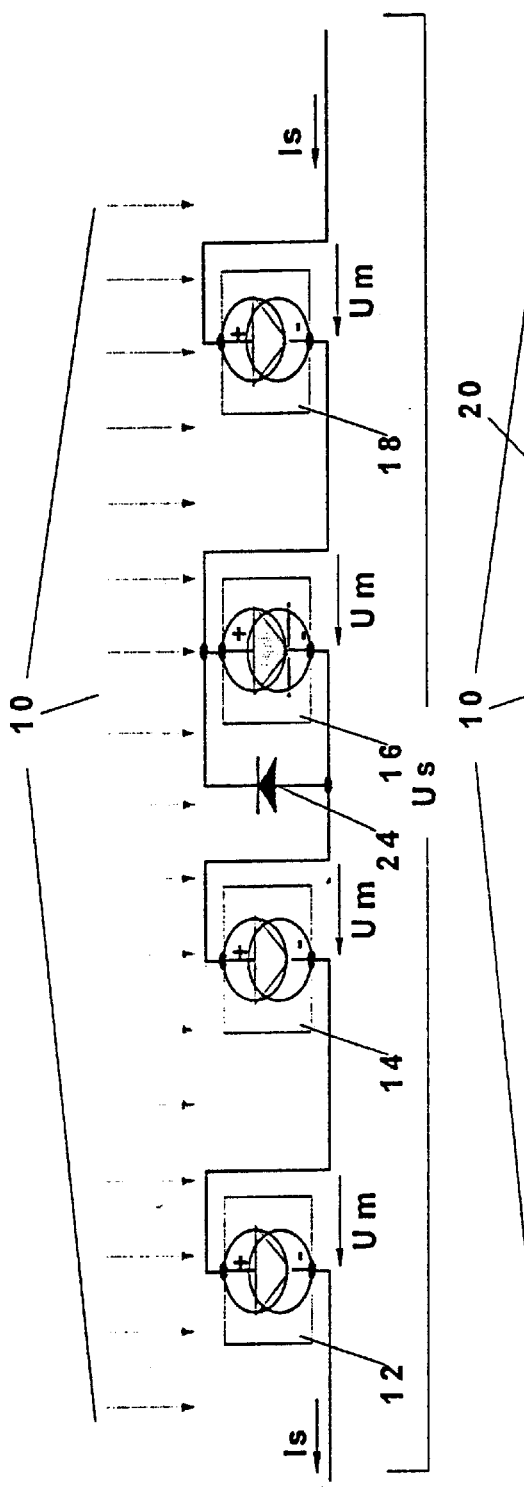
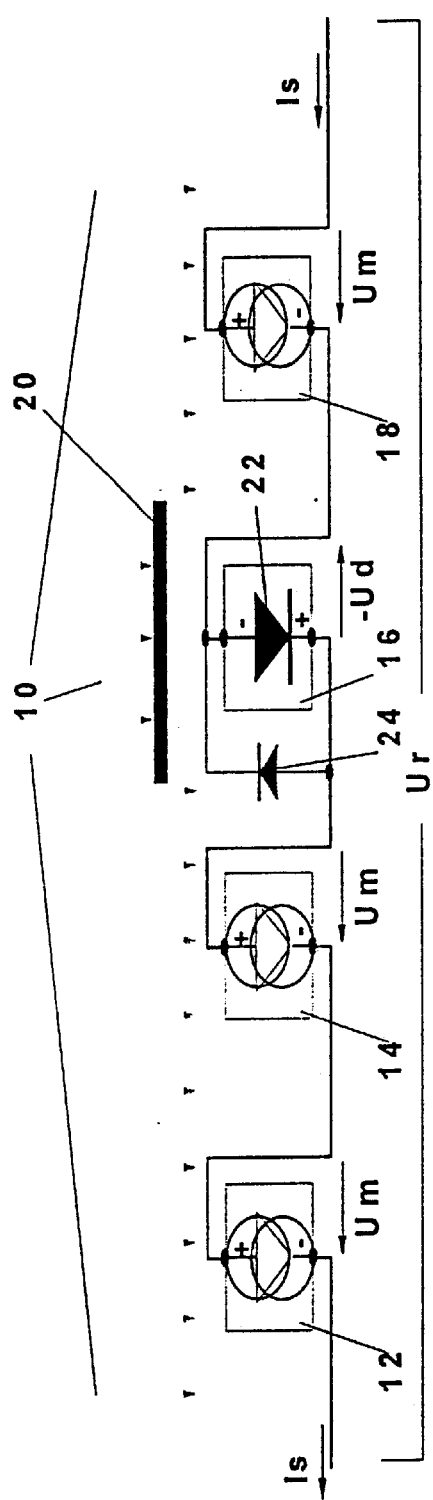
Fig. 1
Fig. 2

SOLAR CELL AND METHOD FOR PRODUCING SUCH A CELL

BACKGROUND OF THE INVENTION

The invention relates to a solar cell, having an integral protective diode which has a polarity opposite the solar cell and includes at least one diode semiconductor layer, and the solar cell has at least one back contact, a substrate as a carrier for photoactive layers that include at least one front layer and one layer toward the substrate of different polarities, and a front contact, and the protective diode is integrated in the solar cell and disposed on the front side of the solar cell. The invention also relates to a method for producing a solar cell, having an integral protective diode which has a polarity opposite the solar cell and includes at least one diode semiconductor layer, and the solar cell has at least one back contact, a substrate as a carrier for photoactive layers that include at least one front layer and one layer toward the substrate of different polarities, and a front contact, and layers are formed in particular by epitaxial growth.

In large-area diodes with areas of a plurality of square centimeters of the kind that solar cells of semiconductor material with at least one p-n junction form, micro-short circuits, that is, local, small-sized electrical (ohmic) connections via the p-n junction of the semiconductor material, are often unavoidable. They arise for instance from surface damage during substrate production or from dopant accumulations, for instance at crystal defects such as dislocations, in particular in the formation of epitaxially formed p-n junctions, for instance in solar cells made from the elements of groups III–IV of the periodic system.

The thus-created micro-short circuits admittedly impede the function of the diode as a solar cell to only a slight extent if at all in the flow direction. However, when the cell is operated in the depletion direction, the defects can cause the destruction of the cell. For instance, if a plurality of solar cells or solar generators are connected in series in a so-called string to form a solar array, then when the p-n junction of a generator is blocking—which can happen if it is in shadow—the solar current is forced through the ohmic micro-short circuits by the high string voltage of the remaining solar cells or generators that are still in the light. This can lead to severe local heating, redoping that produces low impedance, or in other words local severe denaturing of the semiconductor, and finally the destruction of the cell itself.

To avoid such local severe heating or so-called hot spots, it is known in series-connected solar cells to dispose protective diodes parallel to the solar cells, with a flow direction extending counter to that of the solar cells.

In solar cell strings, that is, a group of series-connected solar cells or solar cell modules, the individual solar cells can be protected with integral protective diodes for the sake of achieving greater reliability and avoiding the failure of entire strings (see Lippold, Trogisch, Friedrich: Solartechnik [Solar Technology], Berlin, Ernst, Verlag für Architektur u. Techn. Wiss. [Ernst, Publishing House for Architecture and Engineering] 1984, pages 265, 266). However, the additional expense for internesting to form strings of suitable integral protective diodes that are provided on the backsides of the individual solar cells is considerable, since in addition electrically conductive connectors must be applied to the front side of the solar cells.

A solar cell of the type defined at the outset can be found in German Patent Disclosure DE 38 26 721 A1. For forming the protective diode, it is necessary first to apply an additional layer of semiconducting material to the photoactive layer; this additional layer is then regionally etched away.

From the United States professional journal article J. M., Olson et al, "A 27.3% efficient $Ga_{0.5}In_{0.5}P/GaAs$ tandem solar cell", Appl. Phys. Lett. 56 (7), 1990, pages 623–625, a cascade solar cell is known in which a tunnel diode extends between pairs of photoactive layers that form photoactive cells.

A p-i-n solar cell with a Schottky protective diode can be found in European Patent Disclosure EP 0 327 023 A1.

SUMMARY OF THE INVENTION

The object of the present invention is to refine a solar cell with an integral protective diode, and a method for producing such a cell, in such a way that the effort and expense of production remains low while high reliability is simultaneously attained, and in which the internesting to form strings requires no additional expense. At the same time, the formation of the protective diode should occur in the production of the solar cell itself.

According to the invention, this object is attained by a solar cell in which a tunnel diode extends between the current-generating photoelectrically active layers and the region of the substrate toward the front, the tunnel diode being recessed in the immediate region of the protective diode, and regionally, the region of the substrate toward the front, or a layer toward the front applied to it or formed by it, with a photoactive layer of corresponding polarity toward the front, is the at least one diode semiconductor layer of the protective diode.

According to the invention, the diode semiconductor layer, is regionally formed by a layer of the solar cell itself, and the photoactive layers extend in spaced-apart fashion from the region of the solar cell that forms the diode semiconductor layer. It is also provided that the protective diode is in electrically conductive contact, by its metallizing, with the front contact.

In a refinement of the invention, the protective diode is separated from the photoactive layers of solar cell by an insulating layer such as an antireflection layer, along which the metallizing of the protective diode can extend as far as the front contact. Alternatively, the possibility exists that the protective diode is connected to an electrically conductive connector, which is connected to the electrically conductive connector that originates at the front contact of the solar cell. The possibility also exists that on the one hand the metallizing of the protective diode is connected to the front contact of the solar cell, and on the other, that a connector originates at the metallizing itself and is in turn electrically conductively connected to a further solar cell.

The protective diode itself can be formed as a Schottky diode, MIS contact diode, p-n contact diode or metal-alloy diode.

Schottky diodes are semiconductor metal contacts that behave like a diode. If a metal is put in contact with an undenatured, or in other words low-doped, for instance n-conductive semiconductor, then electrical conduction can take place in only one direction. The metal of a boundary layer to the semiconductor acts in this case like a p-conductive semiconductor, which together with the n-semiconductor forms a a Schottky diode.

MIS contact diodes are similar to the Schottky contacts; the semiconductor and the metal are separated by a thin insulating layer, through which electrons can tunnel. The advantage of such MIS contact diodes is better replicability in production and improved temperature stability.

A diode with a p-n junction is created by redoping the polarization of the semiconductor layer in the surface region, for instance by implantation and/or inward diffusion of a suitable dopant to form a local junction.

Metal-alloy diode contacts are diodes that are created by inward diffusion of a dopant opposite the semiconductor doping from the metal contact during the sintering or the alloying, thus creating a p-n junction in the semiconductor.

According to the invention, it is provided that layers forming the tunnel diode extend between the photoactive layers and the region of the substrate toward the front or the substrate layer having the polarity of the photoactive layer toward the front. Such a tunnel diode is additionally provided whenever the region of the substrate toward the front is embodied as a photoactive region, so that the photoactive region formed on the substrate side is separated by the tunnel diode from the region from which the diode semiconductor layer is formed. In this case, however, the protective diode protects only the solar cell diode toward the front.

In a further feature of the invention, it is proposed that the solar cell is a cascade solar cell comprising a plurality of stacked photoactive layers of the same polarity connected in series by tunnel diodes, such as a tandem solar cell with first and second photoactive layers; and that a first tunnel diode extends between the first and the second photoactive layers toward the front and toward the substrate, respectively, and a second tunnel diode extends between the substrate, or the layer applied or formed on it, and the second photoactive layers on the substrate side.

If the material of the substrate has the same polarity as the photoactive layer extending on the front side, then the region toward the front of the substrate, which forms a layer that has the same polarity as the photoactive layer on the front side and which also forms the diode semiconductor layer, or the layer of the same polarity applied or formed on this region, is separated from the substrate via a further tunnel diode.

One example of a method for producing a solar cell, having an integral protective diode which has a polarity opposite the solar cell and includes at least one diode semiconductor layer, in which the solar cell has at least one back contact, a substrate as a carrier for photoactive layers that include at least one front layer and one layer toward the substrate of different polarities, and a front contact, and in which layers are formed in particular by epitaxial growth, is distinguished by the following method steps:

application or formation of an intermediate semiconductor layer that forms the at least one diode semiconductor layer on or comprising the region toward the front of the substrate of a polarity corresponding to the photoactive layer, toward the front, of the solar cell;

application or formation of a tunnel diode on or comprising the intermediate semiconductor layer;

application or formation of the photoactive layers on the substrate and front sides;

regionally laying the intermediate semiconductor layer bare;

forming the protective diode having the polarity opposite the solar cell using the bared region of the intermediate semiconductor layer, by means of indirect or is direct application of a metallizing onto it and ensuing connection the front contact.

In particular, it is provided that the electrical front contact is formed on the photoactive layer toward the front before the intermediate semiconductor layer is laid regionally bare.

The metallizing of the protective diode is electrically conductively connected directly to the front contact or via an electrically conductive connector originating at the front contact, which electrically conductive connector is in turn connected with further solar cells.

In a preferred embodiment of the invention, it is provided that a shoulder is formed between the bared region of the intermediate semiconductor layer and the photoactive layers on the front and substrate sides, which shoulder is provided with an insulating layer preferably acting as an antireflection layer, along which the metallizing extends at least regionally to the front contact.

It is provided in particular that the protective diode is embodied as a Schottky diode, MIS contact diode, p-n contact diode or metal-alloy diode.

A further proposal of the invention is that the substrate is embodied photoactively on its front side, for instance by inward diffusion of a p-n junction, and that the intermediate semiconductor layer forming the diode semiconductor layer is formed on a substrate, and the tunnel diode and the layers toward the substrate and toward the front are applied to this intermediate semiconductor layer.

A further refinement of the invention provides that first and second and optionally further pairs of photoactive layers of different polarities are applied to a first tunnel diode to form a cascade cell, and a further tunnel diode is disposed for formed between the layers on the substrate side and the layers on the front side.

According to the invention, a protective diode is integrally formed in the front side of a solar cell or solar generator, preferably comprising compounds of groups III–V of the periodic system; by epitaxial growth of photoelectrically active and inactive layers on a substrate that itself can serve to generate photocurrent, the solar cell itself is built up. For forming the protective diode, a layer between the actual photoactive solar cell and the substrate is formed, in particular by epitaxial growth; this is a layer that is suitable for Schottky, MIS, p-n or metal-alloy diode contacts, and it has the same polarity as the photoactive layer on the front side, that is, the topmost layer of the solar cell. Intermediate layers that form a tunnel diode also extend above the corresponding layer with a polarity the same as the substrate.

In particular by local vertical etching away of a small-area region of the active solar cell layers and the intermediate layers that form the tunnel diode, the bared intermediate semiconductor layer acting as a diode semiconductor layer is regionally metallized, thus creating a local surface separation that develops on a diode limited to the area of the metallizing and having the reverse polarity of the cell. Optionally to form the desired type of diode (Schottky contact, MIS contact, or metal-alloy diode contact), a required insulation or diffusion can be done to attain the desired junctions.

Separately from this, the metallizing of the diode can be connected via separate electrically conductive connectors to the front contact of the cell or directly to the front contact by the targeted formation of the contact metallizing. This can be done by providing that an insulating layer, along which the contact metallizing leads to the front contact, is provided along the shoulder, formed in the vertical etching, that extends between the photoactive layers and the optional layers that form the tunnel diode and the intermediate semiconductor layer forming the diode semiconductor layer. With this interconnection, an integrated protective diode that is connected antiparallel to the actual solar cell is obtained.

BRIEF DESCRIPTION OF THE DRAWINGS

Further details, advantages and characteristics of the invention will become apparent not only from the claims and the characteristics to be learned from them—alone and/or in combination—but also from the ensuing description of preferred exemplary embodiments shown in the drawings.

Shown are:

FIG. 1, a string of illuminated solar cells;

FIG. 2, a string of solar cells in which one solar cell is in shadow;

In FIGS. 1 and 2, purely fundamentally, a string 10 of series-connected solar cells 12, 14, 16, 18 is shown; in FIG. 1, all the solar cells 12, 14, 16, 18 are in the light. By comparison, in the string 10 shown in FIG. 2, the solar cell 16 is in shadow (reference numeral 20).

Figure 3:
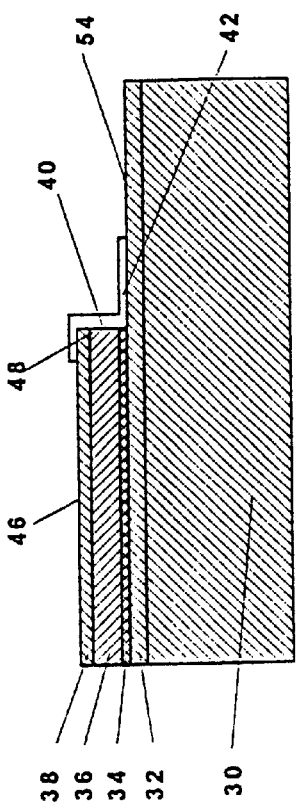
FIGS. 3–7, a solar cell embodied according to the invention, shown in various stages of production.
Figure 4:
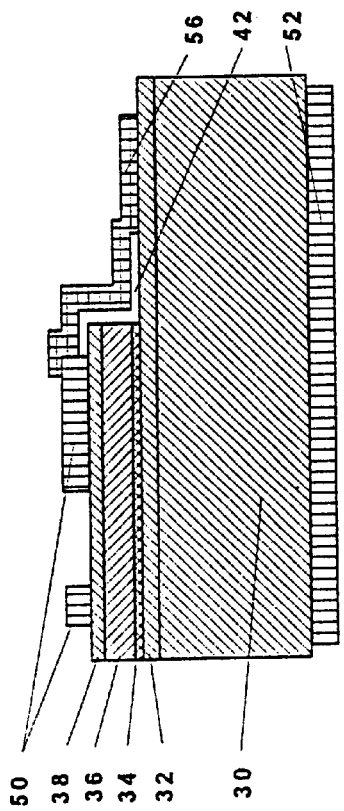
Figure 5:
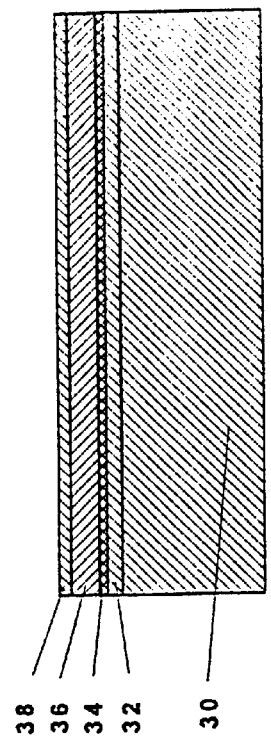
Figure 6:
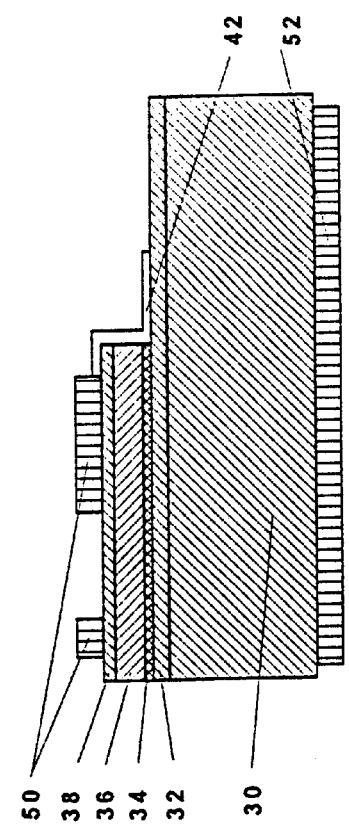

A solar generator of semiconductor material with at least, one photoelectrically active p-n junction of the actual solar cell, when not illuminated, is a large-area diode that purely by example is identified by reference numeral 22. If the solar cell 12, 14, 16, 18 is illuminated, it acts like a current generator for direct current, with a solar current $I_s$ that is proportional to the intensity of the illumination and that has a virtually constant output voltage $U_m$, which corresponds to the flux voltage of the applicable diode 22, minus voltage and current losses caused by internal resistances.

In a solar array, typically a plurality of cells, which in the exemplary embodiment of FIGS. 1 and 2 are the cells 12, 14, 16, 18, are connected in series to form the string 10.

The same current $I_s$ flows through a string of n identical, and identically illuminated, cells connected in series. The virtually equal voltage $U_m$ of each cell of the n cells of the string adds up to a total voltage $U_s$–n★$U_m$ at the ends of the string.

In the string 10 of illuminated cells 12, 14, 18, the cell 16 that is not illuminated because of shadow 20 becomes the diode 22 at which the residual voltage of the string 10 is applied in the depletion direction, in order to force the generated solar current through. Existing micro-short circuits in the active semiconductor layers can lead to destruction of the cell when the cell 16 is operated in the depletion direction. So-called bypass or protective diodes 24 are for protection against such destruction. Such protective diodes 24 are diodes 24, connected antiparallel with the p-n junction of the shaded cell 16, which whenever the p-n junction of the cell. 16 is blocking is polarized in the flux direction and admits the current, which at a voltage $-U_d$ that corresponds to the characteristic curve of the protective diode 24 in the flux direction at the current. Thus the voltage becomes $U_r$. At the is ends of the string because of the absence of the voltage $U_m$ of the shaded cell (16) and reduces the flux voltage of the diode 24, which is $-U_d$, so that $U_r$=$U_s$–$U_m$–$U_d$.

In the unshaded state of the cell 16, the p-n junction of the protective diode 24 blocks the current flow through this diode at a depletion voltage that corresponds to the flux voltage of the associated solar cell 16.

It is indeed known to form such protective diodes 24 per se for solar generators in solar arrays, but doing so is feasible only at very great effort and expense.

According to the invention, such protective diodes are now produced together with the formation of the solar cells themselves, thus simplifying the method and at the same time improving the protective function.

The teaching of the invention will be described in further detail in conjunction with FIGS. 3–9, taking a Schottky diode as an example of a protective diode, but without restricting the invention thereby. The same applies to the forming of the solar cell itself and its materials.

FIGS. 3–7 in principle illustrate the course of the method for producing a first embodiment of a solar cell 26 of the invention, in which a Schottky contact diode 28 is formed as a protective diode.

On a photoelectrically inactive substrate 30 as a carrier, which for example comprises n-conducting monocrystalline germanium, a suitable low-doped semiconductor layer 32 is first applied, for instance in the form of gallium arsenide, which with a suitable metal can form a Schottky contact. The forming of the low-doped semiconductor layer 32 is done preferably by epitaxial growth. The semiconductor layer 32 is preferably a low-doped so-called buffer layer, such as a gallium arsenide buffer layer, which also serves to promote better epitaxial growth and has the conductivity n as the substrate 30. Over the buffer layer 32, a semiconductor tunnel diode 34 is applied epitaxially; it comprises two highly doped layers, of which the layer toward the substrate side is n-doped and the upper layer is p-doped, in order to form a low-impedance junction to a then epitaxially applied p-conducting semiconductor layer 36. The p-conducting semiconductor layer 36 is the photoactive layer toward the substrate, or in other words is the base of the actual solar cells. An n-conducting semiconductor layer 38 toward the front, the so-called emitter, is then applied to the p-conducting semiconductor layer 36 toward the substrate, thus forming the p-n junction to the semiconductor layer 36 or base. As a result, in the example of FIG. 3, the photoactive layers of the solar cell are now complete.

According to the invention, a small region, in comparison to the photosensitive cell area, of the photoactive layers 38, 36, that is, of the emitter and the base, as well as of the tunnel diode 34 is then removed, for instance by local vertical etching. Epitaxially grown photoelectrically nonactive layers that can optionally serve as etch stop layers, as well as other epitaxial layers serving to promote better epitaxial growth or to enhance the photoelectric efficiency, such as window layers or so-called cap layers, can in this sense be counted among the photoactive layers 36, 38, that is, the base and the emitter and thus the actual solar cell.

By the removal, such as etching away, of the layers 38, 36, 34, a shoulder, the so-called etching shoulder 40, is formed, which is covered with an electrically insulating layer 42. This layer 42, given a suitable production sequence, can also be the nonconducting antireflection layer that is typically applied to enhance the entry of light into the front side 44 of the solar cell 26. As FIGS. 4–7 illustrate, the insulating layer 42 extends both along the surface of the intermediate semiconductor layer 32, which is suitable as a diode semiconductor layer, and of the bare outer surface 46 of the semiconductor layer 38 or emitter toward the front, and along the etched-bare peripheral faces 48 of the tunnel diode 34, the p-conducting base 36 and the n-conducting emitter 38; these faces extend perpendicular to the planes defined by the layers 32 and 38.

In an ensuing method step, electrically conductive front and back contacts 50, 52, which serve to draw the solar current of the cell 26, are then applied to the front side 46 of the photoactive layer 38 and thus of the solar cell 26 and to the back side of the substrate 30.

To form the Schottky diode 28 acting as a protective diode, a metallizing 56 suitable for a Schottky contact is applied regionally to the bared region 54 of the intermediate semiconductor layer 32, which in the exemplary embodiment is low-doped, in the form of the epitaxially grown gallium arsenide buffer layer. The area of the metallizing 56 is selected such that it extends over the insulated etching shoulder, that is, the coating 42, to the front contact 50 and thus makes the requisite electrically conductive connection. With this provision, the Schottky contact diode 28 with the p-n junction of the solar cell 26 of opposite polarity, and the electrical coupling of the protective diode 28 to the solar cell 26 itself takes place simultaneously.

Figure 7:
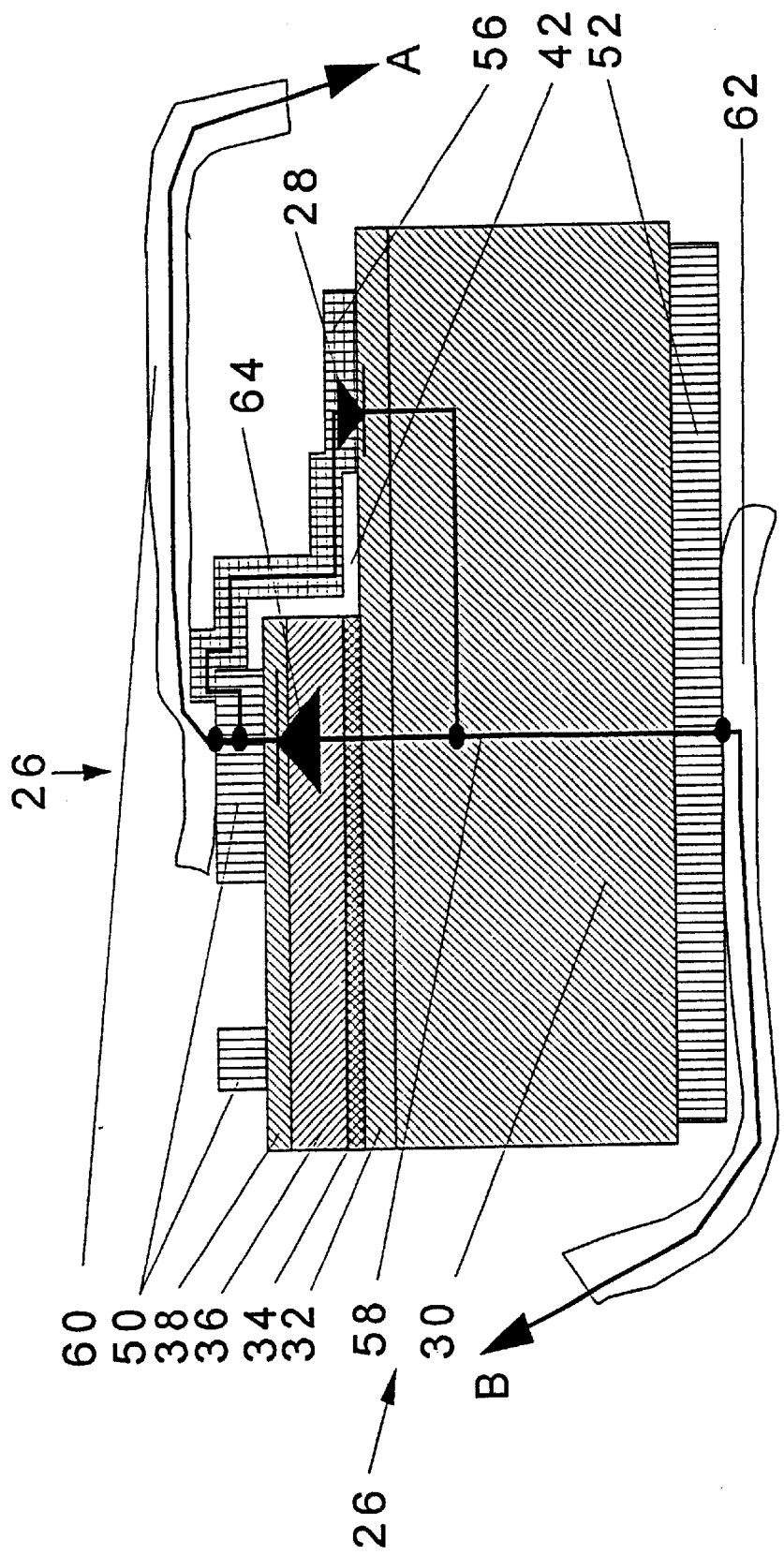

In the enlarged view of the solar cell 26 in FIG. 7, a current flow diagram 58 of the solar cell 26 is plotted; in addition, electrically conductive connectors 60, 62 that extend from the front contact 50 and the back contact 52 are shown, for interconnecting the solar cell 26 having the integrated protective diode 28 to further correspondingly constructed cells to form a string. The connector 60 extends to a back contact of a preceding solar cell A, and the connector 62 leads to a front contact of a following solar cell B.

It can also be seen from the current flow diagram 58 and the substitute circuit diagram shown that the protective diode 28 is connected antiparallel to the diode 64 which forms the actual solar cell and is formed by the photoactive layers 36, 38.

If as the protective diode 28 an MIS contact diode is to be used instead of a Schottky diode, then a suitable insulating layer would be disposed between the intermediate semiconductor layer 32, which in the exemplary embodiment is n-conducting, and the metallizing 56. If a metal-alloy diode is to be used as the protective diode 28, a suitable metal composition is used as contact material, with subsequent sintering or alloying. It is also possible to create a p-n junction locally.

The appropriate diode types embodied as protective diodes can also be used in variants of the solar generator 26 described in conjunction with FIGS. 3–7. One variant, for example, is to reverse all the dopant polarities.

Other examples for modifying the structure of solar cells and generators and for using protective diodes will now be described in conjunction with FIGS. 8 and 9, without in any way restricting the invention. The same reference numerals will be used throughout for identical elements.

Figure 8:
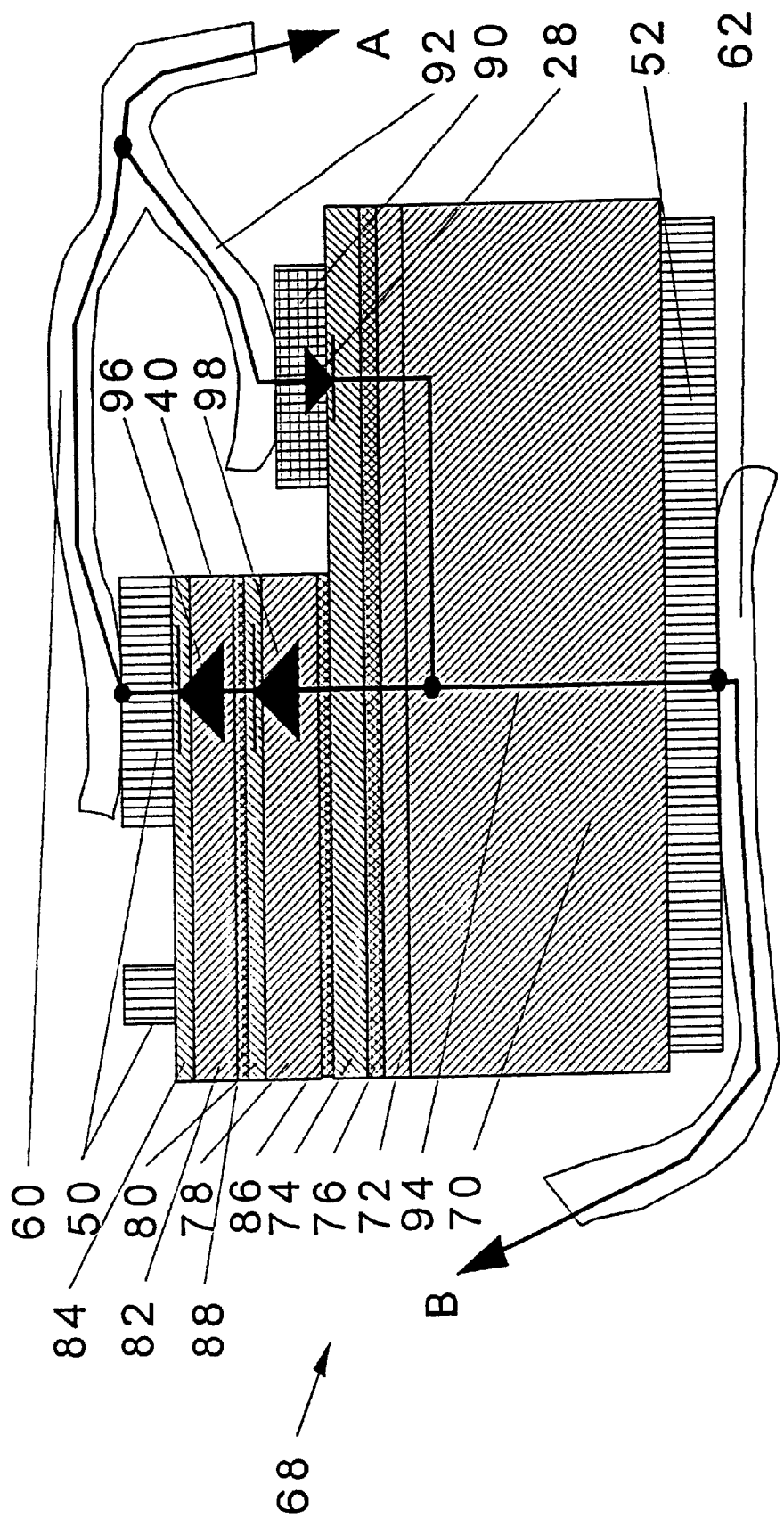
FIG. 8, a second embodiment of a solar cell of the invention.

A solar cell 68 shown in FIG. 8 has a substrate 70, which unlike the substrate 30 of the solar cell 26 has an opposite dopant polarity, that is, comprises p-conducting material. Over the substrate 70, a buffer layer 72 of the same conduction type, p, can be applied. Since with respect to its photoactive layers the solar cell 68 has the same polarity as the solar cell 26, a tunnel diode 76 must be formed between an n-conducting intermediate semiconductor layer 74 that forms the diode semiconductor layer and the substrate 70, or its layer 72 toward the front, in order to assure a low-impedance current passage to the substrate 70 or the buffer layer 72. The tunnel diode 76 has a layer structure that is the reverse of that of the tunnel diode 34; that is, it is p-doped on the substrate side and n-doped on the front side. To form photoactive layers disposed one above the other, first and second pairs of layers 78, 80 and 82, 84 are grown, in particular epitaxially, on the thus-formed substrate and buffer layers 70, 72, tunnel diode 76, and intermediate semiconductor layer 74; the layers 78, 82 are p-conducting semiconductor layers, and the layers 80, 84 are n-conducting semiconductor layers, so as to form one p-n junction each between the respective emitters 80, 84 and the base 78, 82.

A tunnel diode 86 is also formed between the lower layer pair 78, 80, that is, the base 78, and the intermediate semiconductor layer 74, and a further tunnel diodes 88 is formed between the first and second pairs of layers, that is, between the emitter 80 and the base 82; the various layers of these tunnel diodes have polarities that correspond to those of the tunnel diode 34 of the solar cell 26; that is, they are p-doped on the front side and n-doped on the substrate side.

Next, as in the method of FIGS. 3–7, in particular by lower vertical etching away, the intermediate semiconductor layer 74, which forms the diode semiconductor layer required for the protective diode 28, is laid bare, so that by local application of a metallizing 90 the desired Schottky contact can be formed as the desired protective diode 28. Extending from the metallizing 90 in the present case is an electrically conductive connector 92, which is connected to the electrically conductive connector 60, which in turn originates at the front contact 50 of the solar cell 68. Because of this kind of design, there is no need for an insulating layer to extend along the shoulder 40 formed by the vertical etching.

As the current flow diagram 94 and substitute circuit diagram shown in the solar cell 68 demonstrate, the protective diode 28 protects the two diodes 96, 98 that are formed by the photoactive layers 78, 80 and 82, 84.

Figure 9:
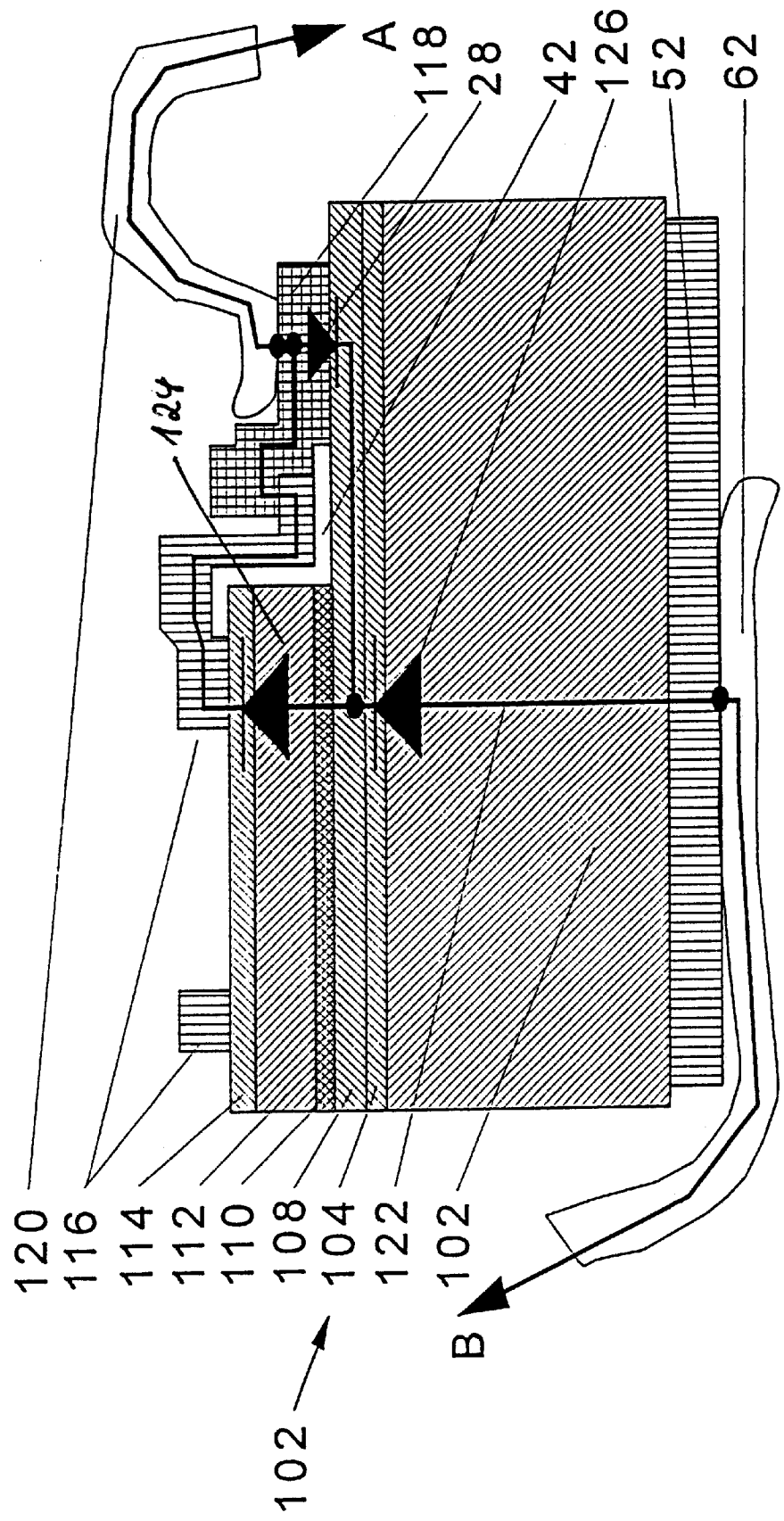
FIG. 9, a third embodiment of a solar cell of the invention.

A solar cell 100 shown in principle in FIG. 9 differs from that of FIG. 7 in that a p-n junction 104 is diffused into a substrate 102, so that it can likewise be used to generate current. In the manner described above, an intermediate semiconductor layer 108 in the form of a diode semiconductor layer extends over this junction, and over the intermediate semiconductor layer in turn a tunnel diode 110 and then further photoactive layers 112, 114 are applied, which form a p-n junction. Next, the photoactive layers 114, 112, that is, the emitter and the base, and the tunnel diode 110 are locally etched away, laying bare the intermediate semiconductor layer 108. The resultant etching shoulder 40 is covered with the insulating layer 42, as in FIG. 7. The front contacts 116 that are then to be applied have a different disposition from the solar cell 26 of FIG. 7 and now extend regionally along the insulating layer 42. Next, onto a bared region of the intermediate semiconductor layer 108, the requisite metallizing 118 is applied, which extends as far as the front contact material extending along the insulating layer 42, so that the requisite electrically conductive connection is obtained. An electrically conductive connector 120 then originates at the metallizing 118 so that it can be joined to the back contact of a preceding solar cell A. Since the front contact 116 is joined directly to the metallizing 118, no corresponding connector 120 has to originate at the front contact 116 itself. As in the exemplary embodiment described above, the further connector 62 originates at the back contact 52 and leads to the front side of the next solar cell. Naturally, the "next" and the "preceding" solar cells or generators should be understood in relative terms.

As demonstrated by the current flow diagram 122 for the cell 100, the protective diode 28 protects only the diode 124 formed of the photoactive layers 112, 114, and not the photoactive region that is formed by the diode 126 shown inside the substrate 102 in the drawing.

Expediently, the cells according to the invention should be embodied geometrically in such a way that the protective diode 28 extends in the vicinity of fastening points of the connector that lead to the other cells, or in the vicinity of bus bars of the front contact, if they are not themselves embodied as such, in order to avoid additional losses of active cell areas from metal lead lines between the protective diodes 28 and front contacts.

It should also be noted that for larger cells, more than one protective diode can be formed.

What is claimed is:

1. A solar cell comprising:
   a substrate carrier for current generating photoactive layers that include at least one front layer and one layer toward the substrate of different polarities;
   a front contact;
   at least one back contact,
   an integral protective diode which has a polarity opposite the solar cell integrated in and disposed on a front side of the solar cell and including at least one diode semiconductor layer; and
   a tunnel diode extending between the photoactive layers an a region of the substrate toward the front, the tunnel diode being recessed adjacent the protective diode, and the region of the substrate toward the front, or a layer toward the front applied to or formed by the front, together with a photoactive layer of corresponding polarity toward the front, making up the at least one diode semiconductor layer of the protective diode.

2. The solar cell of claim 1, wherein a region of the protective diode that forms the at least one diode semiconductor layer extends in spaced-apart fashion from the photoactive layers.

3. The solar cell of claim 1, wherein the protective diode is a Schottky diode, MIS contact diode, P-N diffused contact diode, or metal-alloy contact diode.

4. The solar cell of claim 1, wherein the photoactive layers of the solar cell are separated from the protective diode, or metallizing thereof, by an electrically insulating layer.

5. The solar cell of claim 4, wherein the metallizing of the protective diode extends at least intermittently along the electrically insulating layer.

6. The solar cell of claim 4, wherein the metalizing of the protective diode extends along the electrically insulating layer as far as the front contact of the solar cell.

7. The solar cell of claim 4, wherein the front contact of the solar cell extends regionally along the electrically insulating layer and is joined directly to the metallizing of the protective diode.

8. The solar cell of claim 4, additionally comprising an electrically conductive connector extending from the front contact and/or the metallizing and leading to a back contact of a further solar cell.

9. The solar cell of claim 1, wherein the solar cell is a cascade solar cell, having at least first and second photoactive layers toward the front and toward the substrate, respectively, and that an intermediate semiconductor layer therebetween having polarity corresponding to the photoactive layer toward the front and forming the diode semiconductor layer extends between second photoactive layers toward the substrate and the substrate.

10. The solar cell of claim 9, wherein a tunnel diode is disposed between respective pairs of photoactive layers that form photoactive cells.

11. The solar cell of claim 1, wherein the substrate has a polarity opposite to the photoactive layer toward the front, and the tunnel diode extends between an intermediate semiconductor layer that forms the diode semiconductor layer and the substrate.

12. The solar cell of claim 11, wherein the substrate, in a region toward the front, comprises a p-n junction, over which the intermediate semiconductor layer forming the diode semiconductor layer extends, and
   wherein on the intermediate layer, outside the protective diode, a second tunnel diode and the photoactive layers disposed on the tunnel diode are disposed.

13. A method for producing a solar cell having an integral protective diode which has a polarity opposite the solar cell and includes at least one diode semiconductor layer, the solar cell comprising at least one back contact, a substrate carrier for photoactive layers that include at least one front layer and one layer toward the substrate of different polarities, and a front contact, comprising the steps of:
   applying or forming an intermediate semiconductor layer that forms the at least one diode semiconductor layer on or comprising a region toward the front of the substrate and having a polarity corresponding to the photoactive layer toward the front of the solar cell;
   applying or forming a tunnel diode on or comprising the intermediate semiconductor layer;
   applying or forming the photoactive layers on the substrate and front sides;
   regionally laying the intermediate semiconductor layer bare; and
   forming the protective diode having the polarity opposite the solar cell using the bared region of the intermediate semiconductor layer, by means of indirect or direct application of a metallizing thereon, and ensuing connection to the front contact.

14. The method of claim 13, wherein after the regional baring of the intermediate semiconductor layer, the front contact is disposed on the photoactive layer toward the front.

15. The method of claim 14, wherein the metallizing is electrically conductively connected to the front contact or is connected via an electrically conductive connector, which originates at the front contact and is connected to the back contact of a further solar cell.

16. The method of claim 13, wherein a shoulder is formed by vertical etching between the region of the intermediate semiconductor layer to be laid bare and the photoactive layers on the front and substrate sides.

17. The method of claim 16, wherein an electrically insulating layer is formed along the shoulder extending from the photoactive layer toward the front as far as the bared region of the intermediate semiconductor layer.

18. The method of claim 13, wherein the protective diode is a Schottky diode, MIS contact diode, p-n contact diode or metal-alloy diode.

19. The method of claim 13, wherein a p-n junction is formed on the front of the substrate, on which the intermediate semiconductor layer extends.

20. The method of claim 13, wherein a plurality of pairs of photoactive layers are applied to the intermediate semiconductor layer, and one tunnel diode extends between each of the respective pairs of photoactive layers.

21. The method of claim 13, wherein at least one of the layers that form the tunnel diode, the photoactive layers and the intermediate semiconductor layer are produced by epitaxial growth.

* * * * *